(12) United States Patent
Bedarida et al.

(10) Patent No.: US 6,353,350 B1
(45) Date of Patent: Mar. 5, 2002

(54) PULSE GENERATOR INDEPENDENT OF SUPPLY VOLTAGE

(75) Inventors: Lorenzo Bedarida, Vimercate; Simone Bartoli, Cambiago; Luigi Bettini, Cavenago Brianza, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/721,502

(22) Filed: Nov. 22, 2000

(30) Foreign Application Priority Data

Nov. 26, 1999 (IT) .......................................... MI99A2487

(51) Int. Cl.[7] .................................................. H03K 3/00
(52) U.S. Cl. ........................ 327/291; 327/299; 327/538; 327/543; 323/312; 323/315
(58) Field of Search ................................. 327/291, 294, 327/298, 299, 378, 512, 513, 538, 543, 63, 64, 66; 323/312, 313, 315, 317

(56) References Cited

U.S. PATENT DOCUMENTS

| | | | |
|---|---|---|---|
| 5,063,304 A | * 11/1991 | Iyengar | ........................ 327/543 |
| 5,570,008 A | * 10/1996 | Goetz | ......................... 323/315 |
| 5,640,681 A | * 6/1997 | Barrett, Jr. et al. | ......... 327/541 |
| 5,874,852 A | * 2/1999 | Brambilla et al. | .......... 327/538 |

* cited by examiner

Primary Examiner—Timothy P. Callahan
Assistant Examiner—An T. Luu
(74) Attorney, Agent, or Firm—Lisa K. Jorgenson; E. Russell Tarleton; SEED IP Law Group, PLLC

(57) ABSTRACT

A pulse generator of a type that includes at least one current mirror connected between first and second voltage references and to at least one initiation terminal receiving a pulsive-type initiating signal, connected to a load terminal receiving a load signal, and connected to an output terminal providing an output signal. The pulse generator further includes at least one logic gate having one input terminal connected to an internal control circuit node of the current mirror, having another input terminal connected to receive the initiating signal, and having an output terminal connected to the output terminal of the pulse generator; at least one regulator circuit connected between the current mirror and the second voltage reference and feedback connected to the output terminal; and at least one conductive-type transistor connected between the current mirror and the regulator circuit; the output terminal of the pulse generator delivering a retarded pulsive-type output signal that is independent of the supply voltage and exhibits the same dependency on temperature as the regulator circuit.

15 Claims, 6 Drawing Sheets

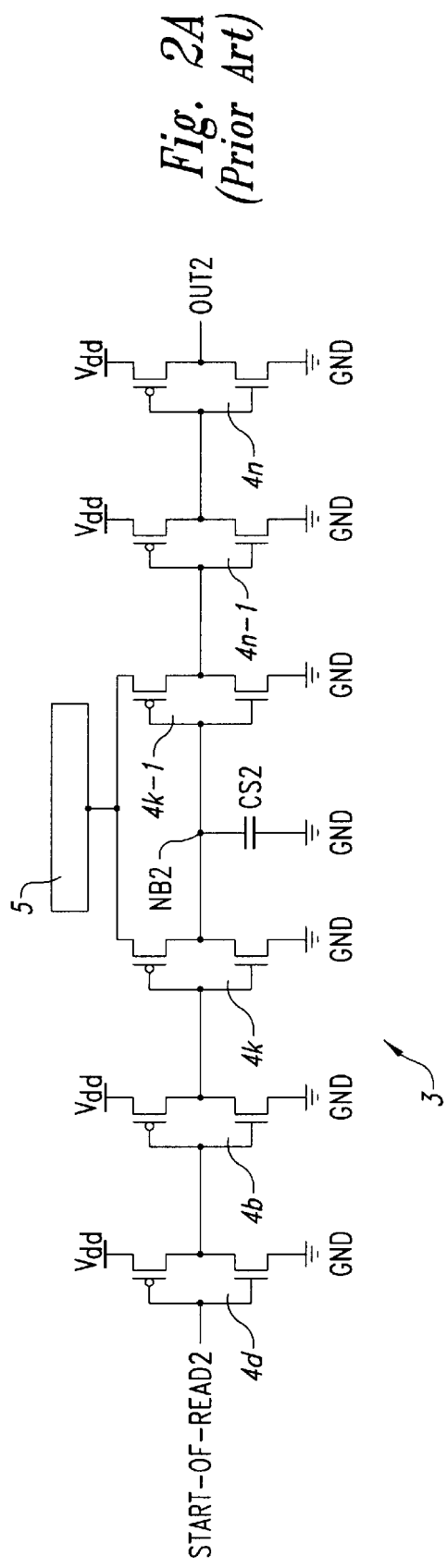
Fig. 2A
*(Prior Art)*
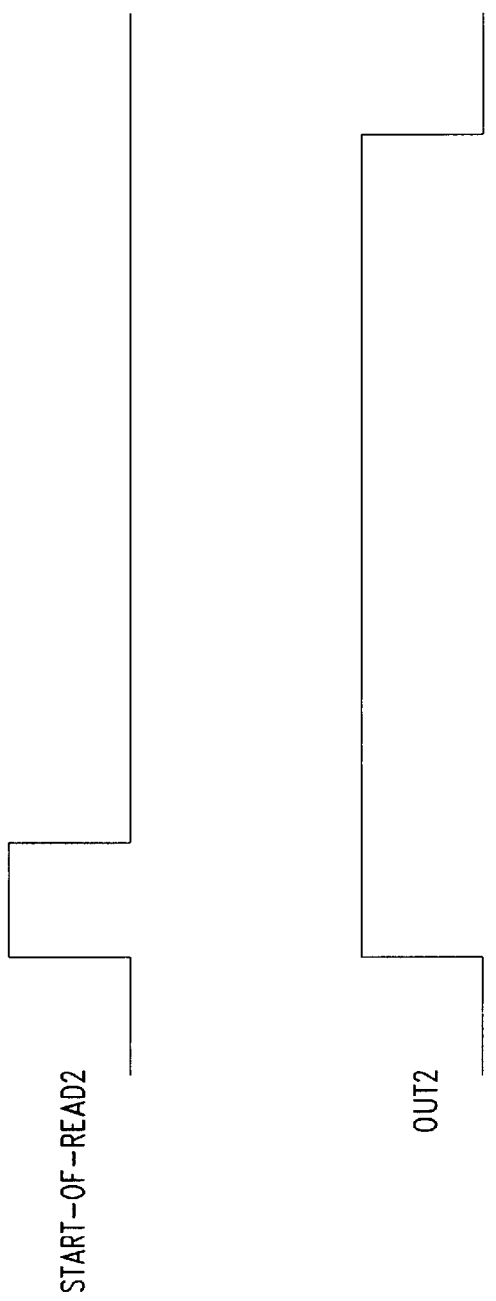
Fig. 2B
*(Prior Art)*
Fig. 2C
*(Prior Art)*

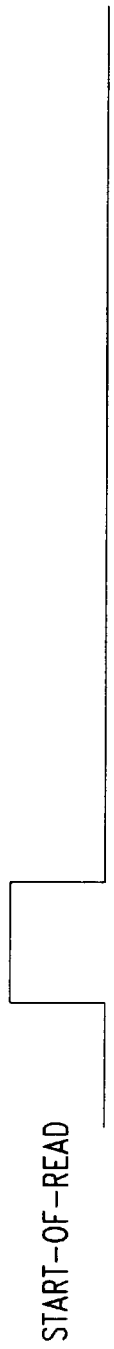
Fig. 3B  START-OF-READ
Fig. 3C  COMP
Fig. 3D  LOAD
Fig. 3E  OUT

PULSE GENERATOR INDEPENDENT OF SUPPLY VOLTAGE

TECHNICAL FIELD

The present invention pertains to a pulse generator, and more specifically, the invention relates, particularly but not exclusively, to a pulse generator that is independent of supply voltage and useful with non-volatile semiconductor memories, the description which follows covering this field of application for convenience of explanation only.

BACKGROUND OF THE INVENTION

As is well known, a timing signal is input to non-volatile semiconductor memories in order to control the operation of a sense amplifier therein.

In particular, the length of the timing pulse should correspond ideally to the rise time duration of the memory wordlines or rows WL, or that of the memory bitlines BL. Thus, the sensing phases can be started in a correctly biased condition of the memory cell.

In most memories, the rise time of the rows WL is primarily dependent on internal resistances of the memory structure, and is only marginally affected by variations in the value of the supply voltage Vdd. This because the row driver is controlled by a fixed voltage that is generated internally and independently of the supply voltage Vdd.

Known are circuits for generating timing signals of a pulse type whose length is jointly or separately dependent on the operating temperature T and the supply voltage Vdd.

Shown schematically in FIG. 1 is an asymmetric delay chain 1 which is controlled by an input signal START-OF-READ1 of a pulse type. This signal, shown in FIG. 1B, generates an output signal OUT1 which is at one time dependent on the operating temperature T and the supply voltage Vdd, as shown in FIG. 1C.

In particular, the asymmetric delay chain 1 comprises a cascade of inverters 2a, 2b, . . . , 2n connected between a first supply voltage reference Vdd and a second voltage reference, specifically a ground GND. The asymmetric delay chain 1 further includes a centroid node NB1 connected to the ground GND through a discharge capacitor CS1.

The asymmetric delay chain 1 additionally includes at least a pair of resistive inverters 2k–1 and 2k connected to said centroid node NB1.

This prior circuit has essentially two disadvantages:

The output signal OUT1 is dependent on the value of the supply voltage Vdd; and the dependency of the circuit operation on the operating temperature T does not correspond to the dependency on temperature of the rows WL.

Likewise, shown respectively in FIGS. 2A, 2B and 2C are an upgraded asymmetric delay chain 3, its input signal START-OF-READ2, and its output signal OUT2.

In particular, the upgraded asymmetric delay chain 3 comprises a cascade of inverters 4a, 4b, . . . , 4n connected between the supply voltage reference Vdd and the ground GND, and has been produced by modifying the asymmetric delay chain 1 by the addition of an internal regulated supply voltage reference 5 effective to power a pair of resistive inverters 4k–1 and 4k connected to a centroid node NB2, itself connected to the ground GND through a discharge capacitor CS2.

It should be noted that this regulated voltage 5 is the same as used by the row driver.

The output signal OUT2 provided by the upgraded asymmetric delay chain 3 is independent of the supply voltage Vdd, but is dependent on the operating temperature T.

Although achieving its objective, this solution also has drawbacks, namely:

The dependency of the circuit operation on the operating temperature T does not correspond to the dependency on temperature of the rows WL; and the internal regulated voltage reference 5 involves increased current consumption with respect to a charge pump generating it.

Particularly in the presence of a high supply voltage Vdd and a low temperature, the prior circuits discussed above show to be too fast, and release the sense amplifier before the row WL can be correctly biased. By contrast, in the presence of a low supply voltage Vdd and a high temperature, they are excessively slow and detain the sense amplifier release.

Also known are circuits that employ dummy lines to simulate the performance of the memory rows to be driven.

The underlying technical problem of this invention is to provide a pulse generator that is independent of temperature and has such structural and finctional features as to overcome the limitations and drawbacks that beset prior art generators.

SUMMARY OF THE INVENTION

The disclosed embodiments of the invention are directed to generating a pulse whose length is independent of the supply voltage, and whose temperature coefficient can follow the wordline rise time, the pulse being synchronized to the trailing edge of an initiating signal.

Based on this principle, the technical problem is solved by a pulse generator that includes at least one current mirror connected between first and second voltage references and to at least one initiation terminal receiving a pulsive-type initiating signal, connected to a load terminal receiving a load signal, and connected to an output terminal providing an output signal. The pulse generator further includes at least one logic gate having one input terminal connected to an internal control circuit node of the current mirror, having another input terminal connected to receive the initiating signal, and having an output terminal connected to the output terminal of the pulse generator; at least one regulator circuit connected between the current mirror and the second voltage reference, and connected in feedback to the output terminal; and at least one conductive-type transistor connected between the current mirror and the regulator circuit, the output terminal of the pulse generator delivering a retarded pulsive-type output signal that is independent of the supply voltage and exhibits the same dependency on temperature as the regulator circuit.

In accordance with another aspect of the invention, a circuit is provided that comprises a pulse generator configured to generate a pulse signal, the length of which is independent of a supply voltage, and having a temperature coefficient that can follow the rise time of a memory word line, the pulse signal synchronized to a trailing edge of an initiating signal.

BRIEF DESCRIPTION OF THE DRAWINGS

The features and advantages of a generator according to the invention will be apparent from the following description of an embodiment thereof, given by way of non-limitative example with reference to the accompanying drawings, wherein:

FIGS. 2A–2C respectively show an upgraded asymmetric delay chain according to the prior art and its input and output signals;

FIGS. 3A–3D respectively show a pulse generator according to the invention and its initial, control, load and output signals.

DETAILED DESCRIPTION OF THE INVENTION

Figure 1A:
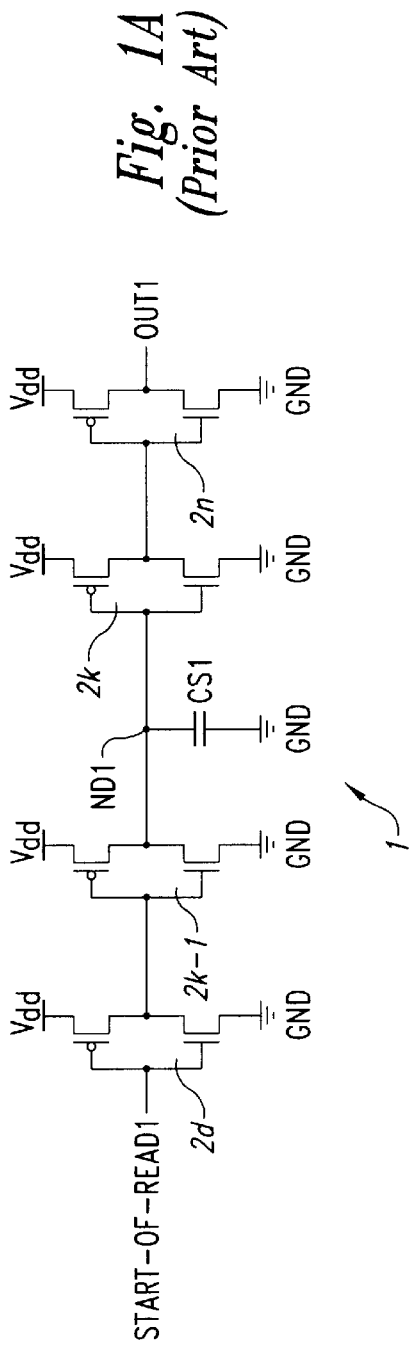
FIGS. 1A–1C respectively show an asymmetric delay chain according to the prior art, and its input and output signals.
Figure 1B:
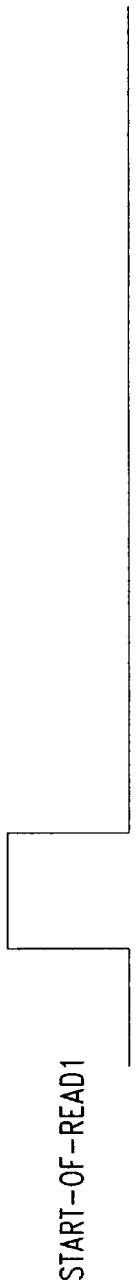
Figure 1C:
Figure 3A:
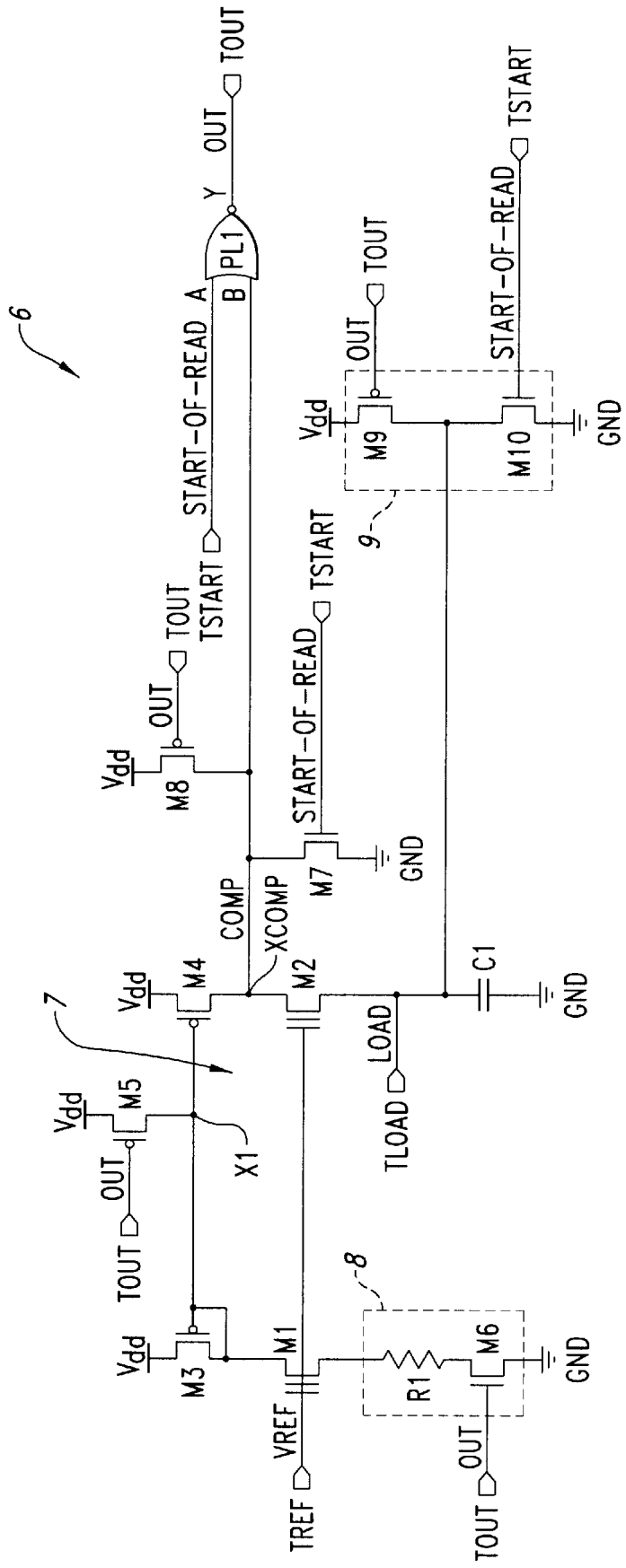

With reference to the drawing views, a pulse generator according to the invention is generally shown at 6.

This pulse generator 6 comprises a current mirror 7 connected between a first supply voltage reference Vdd and a second voltage reference, specifically a ground GND.

The current mirror 7 is further connected to a reference terminal Tref and a load terminal Tload, which terminals are to receive a reference signal Vref and a load signal Vload, respectively.

In one embodiment of the pulse generator 6 according to the invention, the reference signal is generated from a band-gap circuit.

The pulse generator 6 also comprises first M1 and second M2 MOS transistors of the conductive type that have gate terminals connected together and to the reference terminal Tref. Said current mirror 7 comprises a third MOS transistor M3 and a fourth or mirror MOS transistor M4, which are connected respectively between said first M1 and second M2 conductive transistors and the supply voltage reference Vdd and have their gate terminals in common to form an internal circuit node X1, the latter being connected to the reference voltage Vdd through a fifth or feedback MOS transistor M5.

Also, said first conductive transistor M1 is connected to the ground GND through a regulator circuit 8, which is feedback connected to the output terminal Tout, while said second conductive transistor M2 is connected to the load terminal Tload and connected to the ground GND through a capacitor C1.

In particular, said regulator circuit 8 comprises a series of a resistive element R1 and a sixth or regulating MOS transistor M6 having a gate terminal connected to the output terminal Tout.

Finally, it should be specified that the transistor M3 is diode connected and is a P-type transistor, as also are the transistors M4 and M5, whereas the sixth transistor M6 is an N type.

The second conductive transistor M2 and fourth or mirror transistor M4 are connected together and to an internal control circuit node Xcomp, in turn connected to one input of a first output logic gate PL1 which has another input connected to an initiation terminal Tstart, receiving an initiate signal START-OF-READ, and connected to an output terminal Tout, delivering an output signal OUT.

In addition, said control node is connected to the ground GND through a seventh or lower bias transistor M7 having a gate terminal driven by the initiate signal START-OF-READ, and is connected to the supply voltage reference Vdd through an eighth or upper bias transistor M8 which has a gate terminal driven by the output signal OUT.

Finally, the pulse generator 6 comprises a load circuit 9, which is connected between the supply voltage reference Vdd and the ground GND and has an output connected to the load terminal Tload. The load circuit 9 comprises a series of a first load transistor M9, of a resistive PMOS type connected between the supply reference Vdd and the load terminal Tload, and a second load transistor M10, of the NMOS type, which is connected between the load terminal Tload and the ground GND.

The load generators M9 and M10 have respective gate terminals connected to the output signal OUT and the initiate signal START-OF-READ.

Finally, it should be noted that the gate terminals of the transistors M5, M6 and M8 are also feedback driven by means of the output signal OUT.

The operation of the pulse generator 6 of this invention will now be described which is based essentially on the operating scheme outlined herein below.

With the initiate signal STAT-OF-READ steadily low, the load signal LOAD, as present at the load terminal Tload, and the control signal COMP, as present at the internal control circuit node Xcomp, are both forced to the same value as the supply voltage Vdd.

In this condition, the current mirror 7 would be off and no power consumption would occur during DC operation.

As the initiate signal START-OF-READ goes to a logic high, both the control signal COMP and the load signal LOAD are pulled down to the value of the ground GND.

In this condition, the transistors M3 and M4 would be in their resistive state, and the value of the output signal OUT would stay low.

As the initiate signal START-OF-READ is returned to a logic high, the output signal OUT goes to a high value and turns on the current mirror 7.

Since the transistors MS and M6 are highly conductive, the current flowing through the current mirror 7 is given by:

$$I=(Vref-Vth)/r$$

where,

Vref is the value of the reference voltage,

Vth is the value of the threshold voltage of NMOS transistors M5 and M6, and r is the equivalent resistance value of transistors M5 and M6.

When the load signal LOAD is less than the difference between the reference voltage Vref and the threshold voltage Vth, the load terminal Tload and the internal control circuit node Xcomp are drawn after the transistors M1 and M2, which have their gate terminals connected to the reference voltage Vref, until the value of LOAD attains a value Vref−Vth.

It should be noted that, advantageously in this invention, this condition will be met by the pulse generator 6 after a time given by:

$$tload=c*(Vref-Vth)/(Vref-Vth)/r)=r*c$$

where c is the value of the capacitor C1.

At this point, the control signal COMP is no longer "pulled" by the load signal LOAD, so that all the current from the current mirror 7 goes to increase the value of the control signal COMP.

Thus, the corresponding voltage value to the control signal COMP quickly attains the threshold value for initiation of the NOR logic gate PL1; the output signal OUT goes low and the current mirror 7 goes off, the signals COMP and LOAD being both held at the same value as the supply voltage Vdd through the transistors M3 and M4.

The pulse generator 6 is, therefore, enabled to generate a new pulse for no DC consumption, since no expendable current is being derived from the reference voltage Vref.

The length of the output pulse is, therefore, independent of the supply voltage Vdd, and equal to r*c (as previously explained).

If the resistive element R1 of the regulator circuit 8 and the memory row WL are dependent on temperature to an equal degree, a pulse generator 6 is obtained that is independent of the supply voltage Vdd and exhibits the same temperature dependency as the row WL.

Figure 4A:
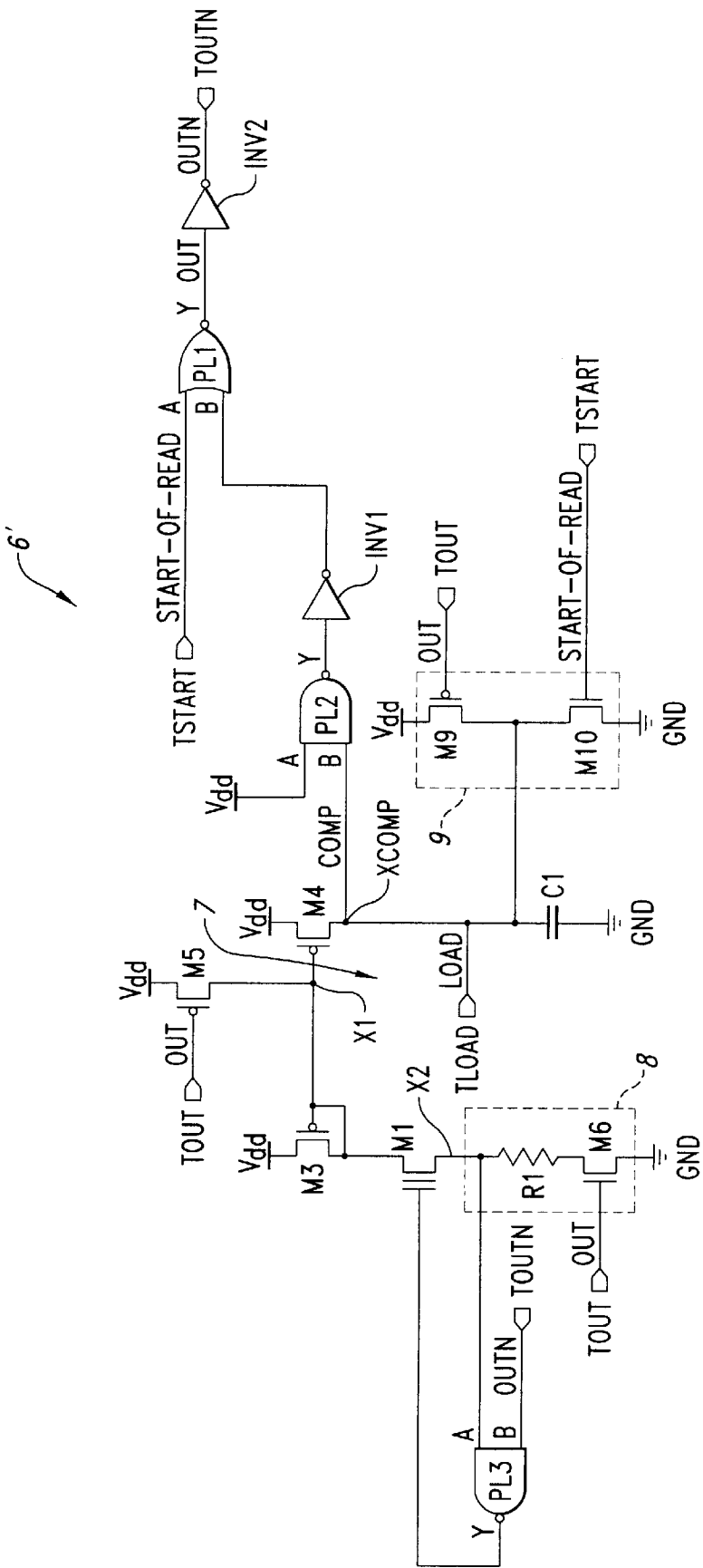
FIGS. 4A–4D respectively show a modified embodiment of the pulse generator according to the invention and its initial, load and output signals.
Figure 4B:
Figure 4C:
Figure 4D:
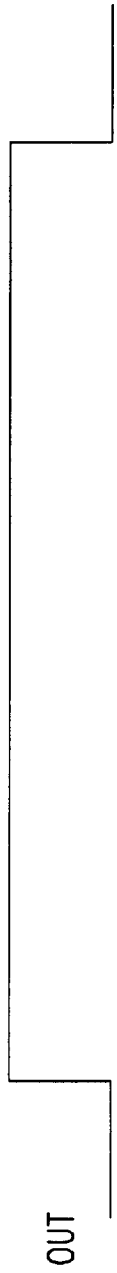

Generally shown at 6' in FIG. 4A is a modification of the inventive pulse generator 6 which effectively provides an independent pulsive signal of the supply voltage, and this without making use of a reference voltage. FIGS. 4B–D show the corresponding initiate, load, and output signals.

The pulse generator 6' comprises a single MOS transistor M1 of the conductive type, which is connected between the current mirror 7 and the regulator circuit 8.

The load terminal Tload is directly connected to the internal control circuit node Xcomp, itself connected to the output logic gate PL1 through a series of a buffer logic gate PL2 and a first logic inverter INV1. The buffer logic gate PL2 has one input terminal connected to the internal control circuit node Xcomp, another input terminal connected to the supply voltage reference Vdd, and an output terminal connected to the inverter INV1, the output from the latter being led to one input terminal of the output logic gate PL1.

Advantageously in this invention, the output logic gate PL1 has its output connected to a second logic inverter INV2, which provides a negated output signal OUTn at a negated output terminal Toutn.

The pulse generator 6' further comprises a feedback logic gate PL3, which has one input terminal connected to an intermediate node X2 between the transistor M1 and the resistive element R1 of the regulator circuit 8, another input terminal to receive the negated output signal OUTn, and an output terminal connected to the gate terminal of said transistor M1.

The pulse generator 6' is completed by the load circuit 9, which comprises first M9 and second M10 load transistors. These transistors are connected between the supply voltage reference Vdd and the ground GND, and are controlled by the output signal OUT and the initial signal START-OF-READ, respectively.

The operation of the modified embodiment 6' of the pulse generator of this invention will now be described, which is based essentially on the operating scheme outlined herein below.

With the initial signal START-OF-READ steadily low, the load signal LOAD at the load terminal Tload is forced to the same value as the supply voltage Vdd.

In this condition, the current mirror 7 would be off and no power consumption would occur during DC operation.

As the initial signal START-OF-READ goes to a logic high, the load signal LOAD is pulled down to the value of the ground GND.

In this condition, the transistors M3 and M4 would be in their resistive state, and the value of the output signal OUT stay low.

As the initiate signal START-OF-READ is returned to a logic high, the output signal OUT goes to a high value and turns on the current mirror 7.

In this condition, the feedback logic gate PL3 would bias the resistive element R1 of the regulator circuit 8 to a voltage value equal to the threshold voltage of the gate PL3, provided that the open-loop gain of the feedback system is sufficiently high.

The current flowing through the current mirror 7 is given by:

$$I = (V_{nandth}/r)$$

where,

Vnandth is the value of the threshold voltage of the feedback logic gate PL3; and r is the value of the resistance R1.

The load terminal Tload is then charged by the current mirror 7 until the load signal LOAD attains the value of the threshold voltage Vnandth of the logic gate PL3, that is after a time lapse given as:

$$t_{load} = c * V_{nandth}/(V_{nandth}/r) = r*c.$$

It should be noted that, for this result to be true, the logic gates PL2 and PL3 should have the same threshold voltage value Vnandth.

At this point, the output signal OUT goes low, and the current mirror 7 goes off, the load signal LOAD being held at the same value as the supply voltage Vdd through the transistors M3 and M4.

Thus, the pulse generator 6' is enabled to generate a new pulse for no DC consumption, since no expendable current is being derived from the reference voltage Vref Similar as in the pulse generator 6 of this invention, the length of the output pulse is, therefore, independent of the supply voltage Vdd, and equal to r*c.

If the resistive element R1 of the regulator circuit 8 and the memory row WL are dependent on temperature to an equal degree, a pulse generator 6' is obtained that is independent of the supply voltage Vdd and exhibits the same temperature dependency as the row WL.

What is claimed is:

1. A pulse generator, comprising: at least one current mirror connected between first and second voltage references and to at least one initiation terminal receiving a pulsive type of initiating signal, and is further connected to a load terminal receiving a load signal, as well as to an output terminal providing an output signal;

at least one logic gate having a first input terminal connected to an internal control circuit node of the current mirror, a second input terminal connected to receive said initiating signal, and having an output terminal connected to the output terminal of the pulse generator;

at least one regulator circuit connected between said current mirror and the second voltage reference, as well as feedback connected to the output terminal; and at least one conductive-type transistor connected between the current mirror and the regulator circuit;

said output terminal of the pulse generator delivering a retarded pulsive-type output signal that is independent of the supply voltage and exhibits the same dependency on temperature as the regulator circuit.

2. The pulse generator of claim 1, wherein said current mirror comprises a pair of mirroring transistors connected to the first voltage reference and having gate terminals in common to form an internal circuit node, said internal circuit node in turn connected to the first voltage reference through a feedback transistor that has a gate terminal feedback-connected to the output terminal of the pulse generator.

3. The pulse generator of claim 1, wherein said regulator circuit comprises a series of a resistive element and a regulating transistor having a gate terminal connected to the output terminal of the pulse generator.

4. The pulse generator of claim 3, wherein said resistive element of the regulator circuit has the same temperature dependency as a memory row.

5. The pulse generator of claim 1, wherein said load terminal is connected to said second voltage reference through a capacitor.

6. The pulse generator of claim 1, wherein said internal control circuit node is connected to the second voltage reference through a lower bias transistor having a gate terminal connected to the initiating terminal, and is connected to the first voltage reference through an upper bias transistor having a gate terminal connected in feedback to the output terminal.

7. The pulse generator of claim 1, comprising a load circuit connected between the first and the second voltage references, and connected with its output to the load terminal.

8. The pulse generator of claim 7, wherein said load circuit comprises a series of a first load transistor connected between the first voltage reference and the load terminal, and a second load transistor connected between the load terminal and the second voltage reference, said load generators having respective gate terminals connected to the output terminal and the initiating terminal, respectively.

9. The pulse generator of claim 1, further comprising a second conductive transistor connected between the current mirror and the load terminal and having a gate terminal connected to the gate terminal of said first conductive transistor and connected to the reference terminal.

10. The pulse generator of claim 1, further comprising a buffer logic gate and a first logic inverter connected in series together between the internal control circuit node and said logic gate.

11. The pulse generator of claim 10, wherein said buffer logic gate has a first input terminal connected to the internal control circuit node and a second input terminal connected to the first supply voltage reference.

12. The pulse generator of claim 10, comprising a second logic inverter connected between said logic gate and a negated output terminal whereat a negated output signal is delivered.

13. The pulse generator of claim 10, further comprising a feedback logic gate having a first input terminal connected to an intermediate node between the conductive transistor and the regulator circuit, a second input terminal to receive a negated output signal, and having an output terminal connected to the gate terminal of said conductive transistor.

14. A pulse generator circuit, comprising:

- a current mirror coupled between first and second voltage references and to an initiating signal terminal that receives a pulse signal, the current mirror further coupled to a load terminal that receives a load signal from a load circuit;
- at least one regulator circuit connected between the current mirror and the second voltage reference, and connected in feedback to an output terminal;
- at least one conductive-type transistor connected between the current mirror and the regulator circuit, the output terminal delivering a retarded pulsive-type output signal having a length that is independent of the supply voltage and a temperature coefficient that can follow a word line rise time in a memory, the pulse being synchronized to the trailing edge of the initiating signal.

15. The circuit of claim 14, wherein the output signal exhibits the same dependency on temperature as the regulator circuit.

* * * * *